US008426262B2

(12) United States Patent
Hoentschel et al.

(10) Patent No.: US 8,426,262 B2
(45) Date of Patent: Apr. 23, 2013

(54) STRESS ADJUSTMENT IN STRESSED DIELECTRIC MATERIALS OF SEMICONDUCTOR DEVICES BY STRESS RELAXATION BASED ON RADIATION

(75) Inventors: Jan Hoentschel, Dresden (DE); Uwe Griebenow, Markkleeberg (DE); Roman Boschke, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 121 days.

(21) Appl. No.: 12/862,203

(22) Filed: Aug. 24, 2010

(65) Prior Publication Data
US 2011/0049641 A1 Mar. 3, 2011

(30) Foreign Application Priority Data
Aug. 31, 2009 (DE) .................. 10 2009 039 420

(51) Int. Cl.
*H01L 21/337* (2006.01)
(52) U.S. Cl.
USPC .................... 438/195; 438/199; 257/E21.328
(58) Field of Classification Search .................. 438/195, 438/199; 257/E21.328
See application file for complete search history.

(56) References Cited

U.S. PATENT DOCUMENTS

| 7,528,028 B2 | 5/2009 | Liang et al. | 438/199 |
|---|---|---|---|
| 2006/0172481 A1 | 8/2006 | Tsui et al. | 438/199 |
| 2008/0044967 A1 | 2/2008 | Teh et al. | 438/199 |
| 2008/0185655 A1 | 8/2008 | Hsu et al. | 257/369 |
| 2009/0179308 A1* | 7/2009 | Stapelmann | 257/649 |

FOREIGN PATENT DOCUMENTS
DE 102009004223 A1 7/2009

OTHER PUBLICATIONS

Translation of Official Communication from German Patent Office for German Patent Application No. 10 2009 039 420.6-33 dated Jun. 21, 2010.

* cited by examiner

*Primary Examiner* — Phat X Cao
(74) *Attorney, Agent, or Firm* — Williams, Morgan & Amerson, P.C.

(57) ABSTRACT

In sophisticated semiconductor devices, an efficient adjustment of an intrinsic stress level of dielectric materials, such as contact etch stop layers, may be accomplished by selectively exposing the dielectric material to radiation, such as ultraviolet radiation. Consequently, different stress levels may be efficiently obtained without requiring sophisticated stress relaxation processes based on ion implantation, which typically leads to significant device failures.

23 Claims, 6 Drawing Sheets

STRESS ADJUSTMENT IN STRESSED DIELECTRIC MATERIALS OF SEMICONDUCTOR DEVICES BY STRESS RELAXATION BASED ON RADIATION

BACKGROUND OF THE INVENTION

1. Field of the Invention

Generally, the present disclosure relates to the field of integrated circuits, and, more particularly, to circuit elements, such as field effect transistors, and manufacturing techniques based on strain-inducing mechanisms using stressed material layers.

2. Description of the Related Art

Integrated circuits typically include a large number of circuit elements located on a given chip area according to a specified circuit layout, wherein, in complex circuits, the field effect transistor represents one predominant circuit element. Generally, a plurality of process technologies for advanced semiconductor devices are currently practiced, wherein, for complex circuitry based on field effect transistors, such as microprocessors, storage chips, graphic devices and the like, MOS technology is one of the most promising approaches due to the superior characteristics in view of operating speed and/or power consumption and/or cost efficiency. During the fabrication of complex integrated circuits using MOS technology, millions of transistors, i.e., N-channel transistors and/or P-channel transistors, are formed on a substrate including a crystalline semiconductor layer. A field effect transistor, irrespective of whether an N-channel transistor or a P-channel transistor is considered, comprises so-called PN junctions that are formed by an interface of highly doped drain and source regions with an inversely or weakly doped channel region disposed between the drain region and the source region. The conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a given extension of the channel region in the transistor width direction, on the distance between the source and drain regions, which is also referred to as channel length. Hence, the conductivity of the channel region substantially determines the performance of MOS transistors. Thus, the reduction of the channel length, and associated therewith the reduction of the channel resistivity, may be a dominant design criterion for accomplishing an increase in the operating speed of the integrated circuits.

The shrinkage of the transistor dimensions, however, involves a plurality of issues associated therewith that have to be addressed so as to not unduly offset the advantages obtained by steadily decreasing the channel length of MOS transistors. One issue associated with reduced gate lengths is the occurrence of so-called short channel effects, which may result in a reduced controllability of the channel conductivity. Short channel effects may be countered by certain design techniques, some of which, however, may be accompanied by a reduction of the channel conductivity, thereby partially offsetting the advantages obtained by the reduction of critical dimensions.

In view of this situation, it has been proposed to enhance device performance of the transistor elements not only by reducing the transistor dimensions but also by increasing the charge carrier mobility in the channel region for a given channel length, thereby increasing the drive current capability and thus transistor performance. In this manner, performance of sophisticated logic circuitry may be enhanced, for instance, in a microprocessor, the performance per watt of consumed power may be increased. In promising approaches, the lattice structure in the channel region may be modified, for instance, by creating tensile or compressive strain therein, which results in a modified mobility for electrons and holes, respectively. For example, creating tensile strain in the channel region of a silicon layer having a standard crystallographic configuration may increase the mobility of electrons, which in turn may directly translate into a corresponding increase of the conductivity of N-type transistors. On the other hand, compressive strain in the channel region may increase the mobility of holes, thereby providing the potential for enhancing the performance of P-type transistors.

One efficient approach in this respect is a technique that enables the creation of desired stress conditions within the channel region of transistor elements by adjusting the stress characteristics of a dielectric layer stack that is formed above the basic transistor structure when the contact level of the device is formed. The contact level, comprised of an interlayer dielectric material and contact elements, may be understood as an interface between the individual semiconductor circuit elements and a complex wiring system or metallization system in which metal lines and vias may provide the complex network of electrical connections. The dielectric layer stack of the contact level typically comprises one or more dielectric layers which may be located close to the transistor and which may also be used in controlling a respective etch process in order to form contact openings connecting to the gate and drain and source terminals. Therefore, an effective control of mechanical stress in the channel regions, i.e., an effective stress engineering, may be accomplished by adjusting the internal stress of one or more of these layers, which may also be referred to as contact etch stop layers, and by positioning a contact etch stop layer having an internal compressive stress above a P-channel transistor and/or by positioning a contact etch stop layer having an internal tensile strain above an N-channel transistor, thereby creating compressive and tensile strain, respectively, in the respective channel regions.

Typically, the contact etch stop layer is formed by plasma enhanced chemical vapor deposition (PECVD) processes above the transistor, i.e., above the gate structure and the drain and source regions, wherein, for instance, silicon nitride may be efficiently used due to its high etch selectivity with respect to silicon dioxide, which is a well-established interlayer dielectric material. Furthermore, PECVD silicon nitride may be deposited with a high intrinsic stress, for example, up to 3.6 Giga Pascal (GPa) of compressive stress and up to 1.6 GPa of tensile stress, wherein the type and the magnitude of the intrinsic stress may be efficiently adjusted by selecting appropriate deposition parameters in order to provide a certain amount of hydrogen in the silicon nitride material, thereby obtaining, in combination with a specific molecular structure, the desired type of stress. For example, ion bombardment, deposition pressure, substrate temperature, gas flow rates and the like represent respective parameters that may be controlled for obtaining the desired intrinsic stress.

The resulting strain level in the channel regions of the adjacent transistor elements is determined by the internal stress level of the dielectric materials, the amount of the stressed dielectric material and the effective offset of the stressed material from the channel region. Consequently, for a given device geometry, the strain level in the channel region is typically increased by increasing the internal stress level of the dielectric materials and also increasing the layer thickness of the dielectric materials. During the ongoing scaling of sophisticated semiconductor devices, however, the layer thickness of the stressed dielectric material is limited by the deposition capabilities of the PECVD techniques and the resulting sophisticated surface topography caused by the gate electrode structures of the transistor elements, in particular when densely packed device regions are considered. Furthermore, in some conventional approaches, a so-called "dual stress liner" approach may be applied in which a compressively stressed dielectric material is positioned above the P-channel transistor while a tensile stressed dielectric material is formed above the N-channel transistor, thereby requiring sophisticated masking and patterning regimes, which may also require a reduced layer thickness in order to avoid deposition and patterning related irregularities, such as voids, undue material residues and the like.

Upon further device scaling, in particular in sophisticated semiconductor devices, a distance between neighboring gate electrode structures may reach values of approximately 40 nm and even less, which may thus require a further reduction of the thickness of the contact etch stop layers, in particular when deposition-related irregularities are to be avoided. Consequently, for given deposition recipes for silicon nitride materials, which may result in intrinsic stress levels of the above-specified magnitudes for tensilely and compressively stressed materials, the overall efficiency of dual stress liner approaches may significantly decrease, thereby making these approaches less attractive, in particular when taking into consideration the significant degree of process complexity involved in the deposition and patterning of the differently stressed etch stop materials. For this reason, an efficient strain-inducing mechanism may be preserved for one type of transistor, for instance for P-channel transistors requiring a high compressive stress level in the silicon nitride material, whereas the internal stress level of the silicon nitride material positioned above N-channel transistors may be efficiently "relaxed" by performing a masked ion implantation process on the basis of appropriate implantation species, such as xenon, germanium and the like. During the ion bombardment, the heavy xenon or germanium species creates heavy damage in the molecular structure of the compressively stressed silicon nitride material, for instance, by destroying corresponding bonds within the dielectric material. On the other hand, the heavy ion bombardment may also give rise to additional irregularities, such as particle contamination by sputtering off material from exposed material surface areas, and the like. Moreover, due to the nature of the ion bombardment, the implantation parameters, such as energy and dose, have to be correctly selected in order to essentially confine the implantation species to the dielectric material under consideration, which may, however, be extremely difficult due to the pronounced surface topography and the variability of penetration depth during an implantation process. As an example, a reduced implantation energy may result in a less efficient stress relaxation, while an increased implantation energy may cause a reduction in transistor performance, for instance, by incorporating a significant amount of implantation species in other device areas, by modifying the surface structure of material layers, such as semiconductor regions, metal silicide regions and the like.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides semiconductor devices and techniques in which the intrinsic stress level of dielectric materials, such as silicon- and nitrogen-containing dielectric materials, may be efficiently adjusted on the basis of radiation, such as ultraviolet radiation, which may initiate a reconfiguration of the molecular structure, for instance, by generating additional silicon/nitrogen bonds, while the influence of the radiation on other materials may be significantly less compared to conventionally used implantation species, such as germanium, xenon and the like. In some illustrative aspects disclosed herein, the amount of hydrogen within a silicon nitride based material may be efficiently reduced by exposing a desired portion of the dielectric material to an appropriate radiation, such as ultraviolet radiation, so that additional silicon/nitrogen bonds may be created within the exposed material portion. Consequently, the radiation may act such that an initial intrinsic stress level may be increasingly "shifted" into the tensile direction, wherein the finally obtained stress level of the exposed material portion may be adjusted on the basis of the initial stress level and the parameters of the radiation exposure process. Consequently, an initial stress level of a dielectric material may be efficiently patterned on the basis of radiation, for instance using appropriate masks and/or using an appropriate scanning regime for providing a radiation beam spot, substantially without creating additional damage in the form of particle contamination and the like. Thus, in sophisticated applications, in which the overall device geometry may demand a reduced thickness of a contact etch stop layer, an efficient strain-inducing mechanism may be applied without requiring sophisticated ion implantation processes and also avoiding complex patterning regimes, even if dielectric layers of different internal stress levels are to be provided.

One illustrative semiconductor device disclosed herein comprises a first transistor element formed in and above a first semiconductor region and a second transistor element formed in and above a second semiconductor region. Moreover, the semiconductor device comprises a dielectric material formed above and between the first and second transistor elements, wherein the dielectric layer comprises a first portion formed above the first semiconductor region and comprises a second portion formed above the second semiconductor region. The second portion has an intrinsic compressive stress level that is higher than an intrinsic compressive stress level of the first portion of the dielectric material. Moreover, the first and second portions comprise substantially the same ratio of silicon to nitrogen species.

One illustrative method disclosed herein comprises forming a dielectric layer above a first semiconductor region and a second semiconductor region of a semiconductor device. The method further comprises selectively exposing a first portion of the dielectric layer above the first semiconductor region to radiation, while exposure of a second portion of the dielectric layer above the second semiconductor region to the radiation is substantially avoided. Moreover, the radiation generates additional silicon and nitrogen bonds in the exposed first portion of the dielectric layer.

A further illustrative method disclosed herein comprises forming a dielectric material layer above and adjacent to a gate electrode structure of a transistor of a semiconductor device. The method further comprises adjusting a stress level of at least a portion of the dielectric material layer by exposing the at least a portion of the dielectric material to ultraviolet radiation, which creates additional silicon and nitrogen bonds in the portion of the dielectric material layer.

BRIEF DESCRIPTION OF THE DRAWINGS

The disclosure may be understood by reference to the following description taken in conjunction with the accompanying drawings, in which like reference numerals identify like elements, and in which.

Figure 1A:
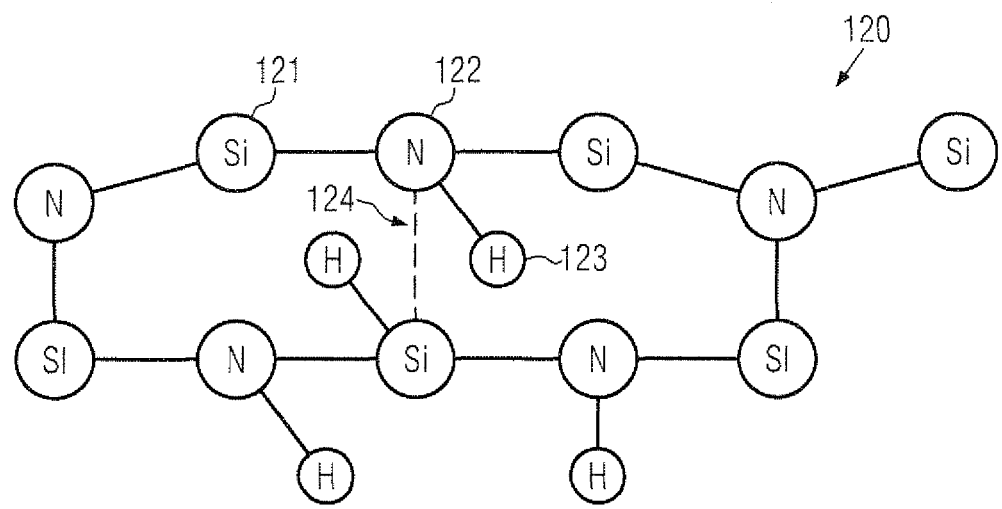
FIG. 1a schematically illustrates the molecular structure of a portion of a silicon nitride based dielectric material including a certain amount of hydrogen, thereby creating a compressive intrinsic stress level.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

According to principles disclosed herein, semiconductor devices and manufacturing techniques are provided in which the strain-inducing effect generated by a dielectric material formed above a semiconductor region may be efficiently locally adjusted by using appropriate radiation, such as UV radiation, in order to locally selectively modify the molecular structure of the initially deposited dielectric material, however, substantially without affecting other materials or without creating additional contaminations, as may typically be associated with ion implantation processes. As is well known, well-established dielectric materials comprising silicon and nitrogen may be deposited on the basis of plasma enhanced deposition recipes, in which process parameters, in particular the ion bombardment during the actual deposition, may result in the incorporation of a more or less pronounced amount of hydrogen species, thereby also providing the possibility of adjusting the initial stress level of the material as deposited. For example, by incorporating hydrogen into a silicon nitride material during the deposition, a plurality of internal silicon/nitrogen bonds may not be created due to the presence of the hydrogen species, thereby disturbing the natural molecular structure and causing a significant compressive stress level in the silicon nitride material. Upon exposing the silicon nitride material to appropriate radiation, the hydrogen species may be "driven out" from the silicon nitride base material in a more or less pronounced degree, depending on the process parameters, so that additional silicon/nitrogen bonds may be increasingly generated, thereby obtaining a shift of the initial intrinsic stress level towards a tensile "direction," which may thus result in a significant reduction of the initial compressive stress level, or which may produce a substantially stress neutral material configuration. In other cases, even a pronounced tensile stress level may be obtained by applying an appropriate exposure dose of the UV radiation.

By applying this concept to sophisticated semiconductor devices, an efficient strain-inducing mechanism may be implemented at various manufacturing stages, for instance upon forming an appropriate dielectric material, such as a silicon nitride base material, which may be used as a spacer layer and the like, wherein the material may be deposited on the basis of well-established process parameters and may be adjusted with respect to its local intrinsic stress level. In other cases, a portion of an interlayer dielectric material, such as a contact etch stop layer, may be provided with a desired intrinsic stress level, which may then be "patterned" on the basis of radiation, even for sophisticated surface topographies, substantially without unduly affecting other device areas or increasing particle contamination, as may frequently be the case in conventional strategies that are based on ion bombardments. Furthermore, since energy density and the integrated energy density of dose of various radiation sources, such as ultraviolet lasers, lamp-based radiation sources and the like, may be efficiently controlled and adjusted, superior process uniformity may also be achieved in tuning the intrinsic stress level of dielectric materials, such as silicon nitride based materials. For example, exposure tools providing ultraviolet radiation, such as conventional lithography tools, may be applied, wherein the local patterning of the intrinsic stress level of the dielectric material within a die region may be accomplished by forming an exposure mask, which may include an absorbing or reflecting material or material portion in order to reduce or avoid exposure of unwanted parts of the die region. Similarly, UV process tools operated on the basis of UV lamps may be used. In other cases, the radiation source itself may be used for locally patterning the intrinsic stress level in a more or less local manner within a single die region, depending on the spatial resolution capabilities of the radiation source, while, in other cases, a more global patterning may be achieved, for instance by applying appropriate scan regimes for directing a laser beam spot or any other radiation spot across preselected areas of a die region. In other cases, a fine local resolution of the stress patterning mechanism may be combined with a more global patterning regime by using an appropriate scan regime in combination with appropriate exposure masks, if desired. Consequently, a plurality of control mechanisms and radiation sources are available for exposing preselected portions of a dielectric material with a well-defined exposure dose in order to obtain the desired degree of reconfiguration of the molecular structure, which in turn is strongly correlated with the intrinsic stress level.

Figure 1B:
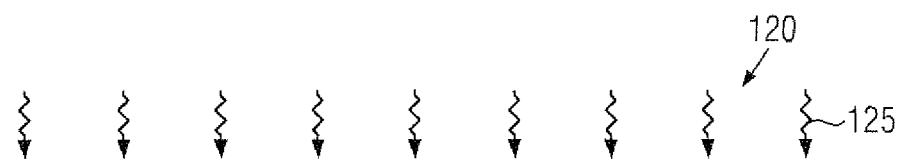
FIG. 1b schematically illustrates the portion of the dielectric material upon exposure to radiation, such as ultraviolet radiation, in order to create additional silicon/nitrogen bonds, thereby resulting in a less compressive or in a tensile intrinsic stress level.
Figure 1B:
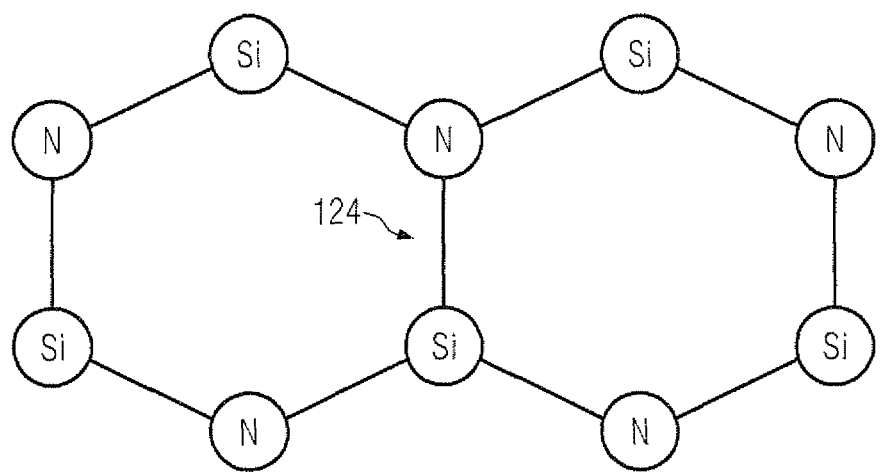

With reference to the accompanying drawings, further illustrative embodiments will now be described in more detail, wherein FIGS. 1a-1b illustrate a simplified model of reconfiguring the molecular structure on the basis of radiation by generating additional silicon/nitrogen bonds, while FIGS. 2a-2h schematically illustrate cross-sectional views of semiconductor devices during various manufacturing stages in adjusting the intrinsic stress level of dielectric materials.

FIG. 1a schematically illustrates a dielectric material 120 on a molecular level, which comprises silicon atoms 121 and nitrogen atoms 122, which may roughly correspond to the stoichiometric formula as $Si_3N_4$. Furthermore, at least one further species 123, such as hydrogen, may be incorporated in the dielectric material 120 to a certain degree, which may be adjusted on the basis of the deposition parameters, when forming a silicon nitride based dielectric material on the basis of well-established plasma enhanced deposition recipes. It should be appreciated that, for convenience, a dielectric material, which may comprise substantially silicon 121 and nitrogen 122, may also be referred to as a silicon nitride material, irrespective of the actual hydrogen contents. As previously explained, the intrinsic stress level of the dielectric material 120 may be adjusted on the basis of the deposition conditions during a plasma enhanced deposition process, for instance by adjusting the degree of ion bombardment, i.e., the resulting acceleration voltage between the deposition ambient and a substrate surface, given other process parameters, such as pressure, temperature, gas flow rates and the like. Consequently, during the plasma enhanced deposition process, a more or less pronounced amount of the hydrogen species 123 may be incorporated and may thus form N—H bonds and Si—H bonds, which in turn may result in N—H/Si—H bonds, which, therefore, substitute a "regular" N—Si bond 124. Consequently, the molecular structure may have a configuration that may result in a certain degree of compressive stress, depending on the amount of hydrogen 123 incorporated in the basic silicon nitride material. As previously indicated, in this manner, very high compressive stress levels up to 3 GPa and higher may be achieved.

FIG. 1b schematically illustrates the dielectric material 120 when exposed to radiation 125, which may have sufficient energy in order to break up the N—H, Si—H, N—H/Si—H bonds so as to finally remove a certain amount of the previously incorporated hydrogen species 123 (FIG. 1a). For example, ultraviolet radiation with a wavelength of approximately 350 nm and less may be appropriate for depositing sufficient energy in order to efficiently remove hydrogen, thereby reconfiguring the molecular structure to a certain degree, depending on energy and dose of the radiation 125, in order to create additional N—Si bonds, such as the bond 124. Consequently, in a global scale, the dielectric material 120 may receive a certain amount of additional N—Si bonds, which may result in a certain degree of reconfiguration, thereby imparting a "tensile" stress component to the material 120. Depending on the initial stress level and, thus, on the initial amount of hydrogen in the material 120 as deposited, a "shift" of the initial stress level into the tensile "direction" may be achieved. In this manner, the initial compressive stress level may even be compensated fore or may be shifted into a tensile stress level, wherein it should be appreciated that a tensile stress condition may represent a material composition with a significantly reduced degree of N—H/Si—H bonds. Consequently, for a given initial stress level, the exposure to the radiation 125 may provide an efficient control mechanism for adjusting a finally desired stress level in the material 120 by controlling the exposure dose for a given wavelength or wavelength distribution of the radiation and the like. As will be explained later on in more detail, a desired initial stress level may be provided, which may be locally shifted toward the tensile direction, until a second desired stress level may be achieved. It should be appreciated that the initial stress level may not necessarily represent a compressive stress level, but also an initial tensile stress may be created, for instance, on the basis of appropriate deposition conditions, and the stress level may further be increased into the tensile direction upon exposure to the radiation 125, wherein, if desired, a local patterning of the tensile stress level may be achieved on the basis of an appropriate masking regime, a scan regime or any combination thereof.

Consequently, the materials 120 prior to and after being exposed to the radiation 125 may have substantially the same ratio of nitrogen species to silicon species and may merely differ in their hydrogen contents. Thus, a difference in the molecular structure is achieved, without requiring the incorporation of an additional species, such as xenon, germanium and the like, in order to perform a stress relaxation process as may frequently be used in conventional strategies, as explained above. Furthermore, it should be appreciated that, in other cases, an additional species, such as carbon, may be incorporated into the dielectric material 120, for instance, with a fraction of approximately 5 atomic percent and higher, wherein a similar mechanism as described with reference to FIGS. 1a and 1b may result in a reconfiguration of the molecular structure in order to adjust a desired final stress level of the material 120.

Furthermore, appropriate process parameters for a process using the radiation 125 may be determined on the basis of experiments, in which various process conditions, such as exposure time, and thus dose, for a given radiation source may be applied to dielectric materials 120 having different intrinsic initial stress levels. Consequently, upon determining the final stress level, a desired correlation between an initial stress level and the corresponding exposure conditions may be established in order to correctly adjust the desired final stress level during volume production conditions. For instance, efficient radiation sources, such as lasers, lithography tools, lamp-based UV process tools and the like, are readily available in the production facility of sophisticated microstructure devices and semiconductor devices, which may thus be efficiently used for applying the radiation 125 without requiring additional hardware resources. Furthermore, in some illustrative embodiments, the "radiation" 125 may also be provided in the form of an electron bombardment, wherein an acceleration voltage may be appropriately selected so as to initiate the desired reconfiguration of the dielectric material 120. For example, an electron shower or a more or less locally restricted electron beam may be used as the radiation 125, depending on the requirements with respect to overall process throughput, spatial resolution and the like. Consequently, in this application, the term radiation is to be understood so as to include electromagnetic radiation of a sufficiently small wavelength to initiate the structural reconfiguration as described above, and also any type of electron bombardment which may also result in a structural reconfiguration as described with reference to FIGS. 1*a* and 1*b*, unless a specific type of radiation is explicitly mentioned in one of the embodiments of the present disclosure.

Figure 2A:
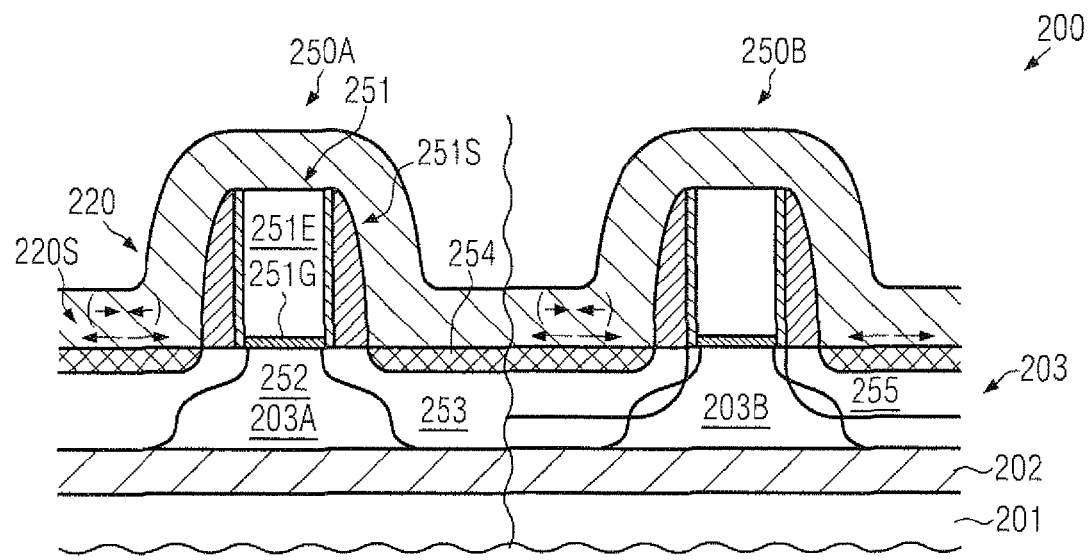
FIGS. 2a-2d schematically illustrate cross sectional views of a semiconductor device during various manufacturing stages in implementing a strain-inducing mechanism for transistors of different conductivity type on the basis of a dielectric overlayer that is selectively exposed to radiation, according to illustrative embodiments.

FIG. 2*a* schematically illustrates a cross-sectional view of a semiconductor device 200, which may comprise a substrate 201, such as a semiconductor substrate, an insulating substrate and the like, above which may be formed a semiconductor layer 203, such as a silicon-based layer, a silicon/germanium layer and the like. As previously indicated, the charge carrier mobility in silicon-based crystalline materials may be significantly modified on the basis of a certain strain component and, thus, silicon-based materials may receive superior electronic characteristics by providing a specific strain component therein so that the application of the strain-inducing mechanism based on dielectric materials formed above a semiconductor material may be highly advantageously applied to silicon-based material. It should be appreciated, however, that the semiconductor layer 203 may be comprised of any other appropriate semiconductor material, when applying a strain in a locally restricted manner is considered advantageous. Furthermore, in the embodiment shown, a buried insulating material 202, such as a silicon dioxide material, a silicon nitride material and the like, may be formed between the substrate 201 and the semiconductor layer 203, thereby defining an SOI (silicon- or semiconductor-on-insulator) configuration. In other cases, the buried insulating layer 202 may be omitted, at least locally in some device areas of the device 200, as will also be described later on in more detail. The semiconductor layer 203 may comprise semiconductor regions 203A, 203B, which may be understood as regions in and above which one or more semiconductor circuit elements, such as transistors and the like, are to be formed. In this sense, the semiconductor regions 203A and 203B may also be referred to as active regions, which may be laterally delineated by appropriate isolation structures (not shown), such as shallow trench isolations and the like. Consequently, the strain level in the semiconductor regions 203A, 203B, or at least in portions thereof, such as regions 252, which may also be referred to as channel regions 252 in the embodiment shown, may result in superior electronic characteristics, such as charge carrier mobility and the like. For this purpose, a dielectric layer 220 may be formed above the semiconductor regions 203A, 203B, which, in the embodiment shown, may represent a substantially continuous material layer having a substantially uniform stress level 220S, such as a compressive stress, a substantially neutral stress level or a tensile stress level. For instance, the dielectric layer 220 may be provided in the form of a silicon nitride based material, that is, a dielectric material comprising silicon and nitrogen in combination with a certain degree of hydrogen, as previously explained with reference to the layer 120 described in FIGS. 1*a* and 1*b*. In sophisticated applications, a thickness of the layer 220 may be approximately 50 nm and less, depending on the overall surface topography of the device 200 in a manufacturing stage prior to the deposition of the layer 220. For example, a thickness of 40 nm, 20 nm and less may be required in semiconductor devices in which a minimum distance between adjacent circuit features, such as gate electrode structures 251, may be less than approximately 100 nm and less. In these cases, the layer 220 may have to be deposited under very restrictive deposition conditions, wherein additional materials, such as etch stop materials and the like, may affect the overall strain transfer efficiency so that complex patterning regimes for providing layer portions of different internal stress levels above the semiconductor regions 203A, 203B, respectively, may not be applicable. It should be appreciated, however, that the principles disclosed herein may also be applied to less critical devices, in which an increased layer thickness may be applied and/or in which the layer 220 may be provided with different internal stress levels above different semiconductor regions, possibly in combination with additional etch stop or etch control materials.

Furthermore, in the embodiment shown, circuit elements 250A, 250B, in the form of field effects transistors, may be formed in and above the semiconductor regions 203A, 203B, respectively. In the manufacturing stage shown, the transistors 250A, 250B may comprise the gate electrode structures 251, which in turn may comprise one or more electrode materials or placeholder materials 251E and a gate insulation material 251G, which may separate the electrode material 251E from the channel region 252. It should be appreciated that, depending on the overall process and device requirements, the electrode material 251E may comprise semiconductor materials, metal-containing materials and the like. Similarly, the gate insulation layer 251G may comprise any appropriate dielectric material, such as conventional dielectrics in the form of silicon oxide, silicon nitride and the like and/or high-k dielectric materials, which are to be understood as dielectric materials having a dielectric constant of 10.0 or higher. Furthermore, the gate electrode structures 251 may comprise a spacer structure 251S, which may have any appropriate configuration in terms of individual spacer elements, possibly in combination with etch stop liners and the like. Moreover, source and drain regions 253 may be formed in the regions 203A, 203B and may comprise metal silicide regions 254 in order to reduce the contact resistivity of the devices 250A, 250B. It should be appreciated that, in sophisticated semiconductor devices, a length of the electrode material 251E, i.e., in FIG. 2*a*, the horizontal extension thereof, may be 50 nm and less, such as 40 nm, 20 nm and the like, depending on the technology node under consideration. Moreover, as illustrated in FIG. 2*a*, in some cases, one or both transistors 250A, 250B may comprise an additional strain-inducing mechanism, which is illustrated in the form of an embedded strain-inducing semiconductor alloy 255, which may be provided in the form of a silicon/germanium alloy, a silicon/tin alloy, a silicon/germanium/tin alloy, a silicon/carbon alloy and the like. For instance, the transistor 250B may represent a P-channel transistor, in which a high compressive strain component in the channel region 252 may provide superior transistor performance. In this case, the material 255 may be provided in the form of a compressive strain-inducing semiconductor alloy, such as a silicon/germanium alloy that is embedded in a silicon-based material.

The semiconductor device 200 as shown in FIG. 2*a* may be formed on the basis of well-established process techniques in accordance with the overall design rules of the device 200. For example, after forming the active regions 203A, 203B, for instance by providing isolation structures and incorporating a basic dopant concentration, the electrode material 251E and the gate insulation layer 251G may be formed in accordance with sophisticated process techniques. For example, the gate insulation material 251G may be formed by oxidation in combination with deposition and the like, followed by the deposition of one or more appropriate electrode materials, which may then be patterned on the basis of sophisticated lithography and etch techniques. Thereafter, if required, the material 255 may be locally embedded in the region 203B, which may be accomplished by forming cavities and refilling the cavities with the desired semiconductor alloy, while masking the transistor 250A. Thereafter, the further processing may be continued by forming the drain and source regions 253 in combination with the spacer structure 251S by using implantation processes and appropriate masking regimes in order to provide the desired dopant species for the drain and source regions 253 in the transistors 250A, 250B. During the implantation process, the spacer structure 251S may act as an implantation mask in order to appropriately create the lateral and vertical dopant profile. Next, the metal silicide regions 254 may be formed, if required, which may be accomplished on the basis of well-established silicidation process strategies. It should be appreciated that the gate electrode structure 251 may be covered by an appropriate dielectric material, if the formation of a metal silicide in the material 251E is to be avoided. In other cases, a metal silicide (not shown) may also be formed in a portion of the electrode material 251E.

As explained above, depending on the overall configuration of the semiconductor device 200, a more or less pronounced surface topography may be provided after the described process sequence in the form of the gate electrode structures 251, in particular in densely packed device regions, in which a distance between the gate electrode structures 251 may require an adaptation of the thickness of the layer 220 in order to avoid deposition-related irregularities, such as voids between two neighboring gate electrode structures 251. Hence, the dielectric layer 220 may be deposited on the basis of appropriately selected process parameters, as described above, in order to obtain a desired conformal deposition behavior and also to obtain the desired intrinsic stress level 220S. For example, the layer 220 may be formed directly on the exposed portion of the active region 203A, i.e., on the metal silicide regions 254 and on the gate electrode structure 251, thereby enhancing the overall strain transfer efficiency from the layer 220 into the channel region 252. In the embodiment shown, the initial stress level 220S may be selected such that enhancement of charge carrier mobility for the transistor 250B may be obtained, which, in this example, may be accomplished by providing a moderately high compressive stress level. On the other hand, the compressive stress level 220S may result in a reduction of the charge carrier mobility in the transistor 250A, which, however, may be compensated for or even overcompensated for on the basis of locally shifting the intrinsic stress level 220S towards the tensile direction, as previously explained with reference to FIGS. 1a and 1b. It should be appreciated, however, that, in other cases, any other appropriate initial stress level may be selected, which may then be locally adapted in accordance with the device requirements. For example, a substantially neutral stress level may be applied and may then be converted into a tensile stress level above the transistor 250A in order to obtain an enhanced transistor performance, while the initial neutral stress level may not negatively affect the transistor 250B, which may have an additional strain-inducing mechanism, such as the embedded semiconductor alloy 255. In other cases, an initial tensile stress level may be provided and may be locally increased, if considered appropriate for an overall enhancement of the semiconductor device 200.

Figure 2B:
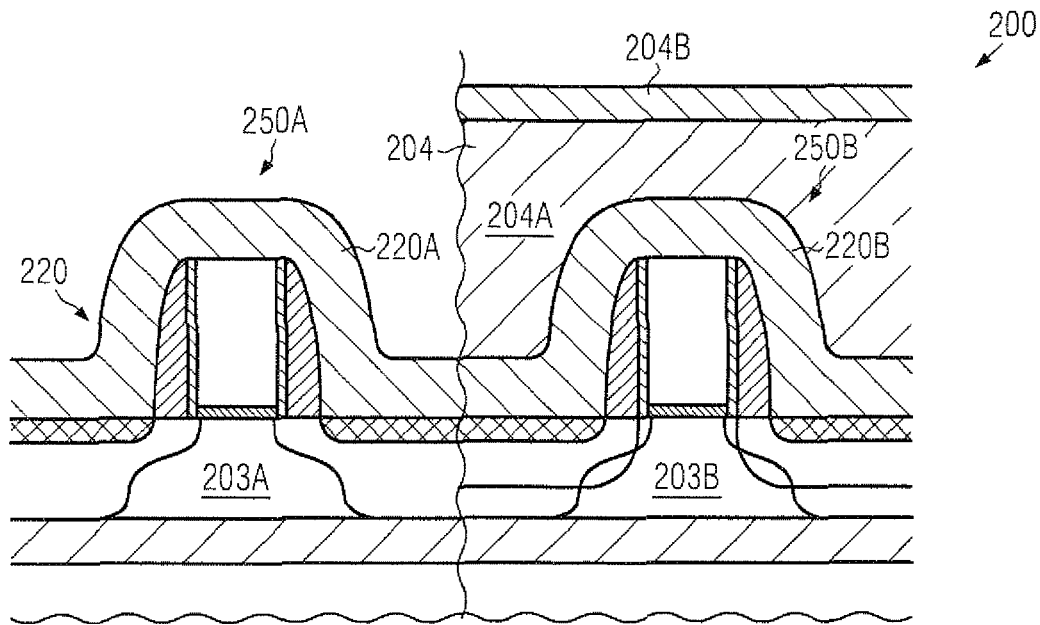

FIG. 2b schematically illustrates the semiconductor device 200 in a further advanced manufacturing stage, in which a radiation or exposure mask 204 may be provided so as to expose a portion 220A of the layer 220 formed above the active region 203A and, thus, above the transistor 250A, while covering a portion 220B formed above the semiconductor region 203B and the transistor 250B. The radiation mask 204 may be provided in the form of any appropriate material so as to substantially reduce the penetration of radiation into the portion 220B in the subsequent manufacturing stage. For example, a plurality of materials may be used which may provide sufficient radiation absorption capabilities in order to efficiently block the penetration of the portion 220B. In other cases, at least a portion of the radiation mask 204 may represent a highly reflective material so as to efficiently suppress penetration of deeper areas of the mask layer 204 by UV radiation. For example, the mask 204 may be comprised of a material 204A, which may be patterned substantially without affecting the underlying material 220, for instance by providing a polymer material, a resist material and the like, wherein a further material 204B may be provided, for instance in the form of a UV reflecting material, such as a metal layer and the like. For example, a plurality of metal materials may typically be used during the formation of sophisticated semiconductor devices, and any of these metal-containing materials may be efficiently used for forming the layer 204B. Thereafter, the corresponding mask layer or layer stack may be patterned, for instance on the basis of well-established lithography techniques, in order to expose the portion 220A. In other cases, appropriate dielectric materials, such as silicon dioxide, silicon oxynitride and the like, may be used in combination with a highly radiation absorbing or reflecting material, wherein efficient patterning strategies may be applied, as a plurality of selective etch recipes are available, for instance, for silicon oxide based materials with respect to the material layer 220.

Figure 2C:
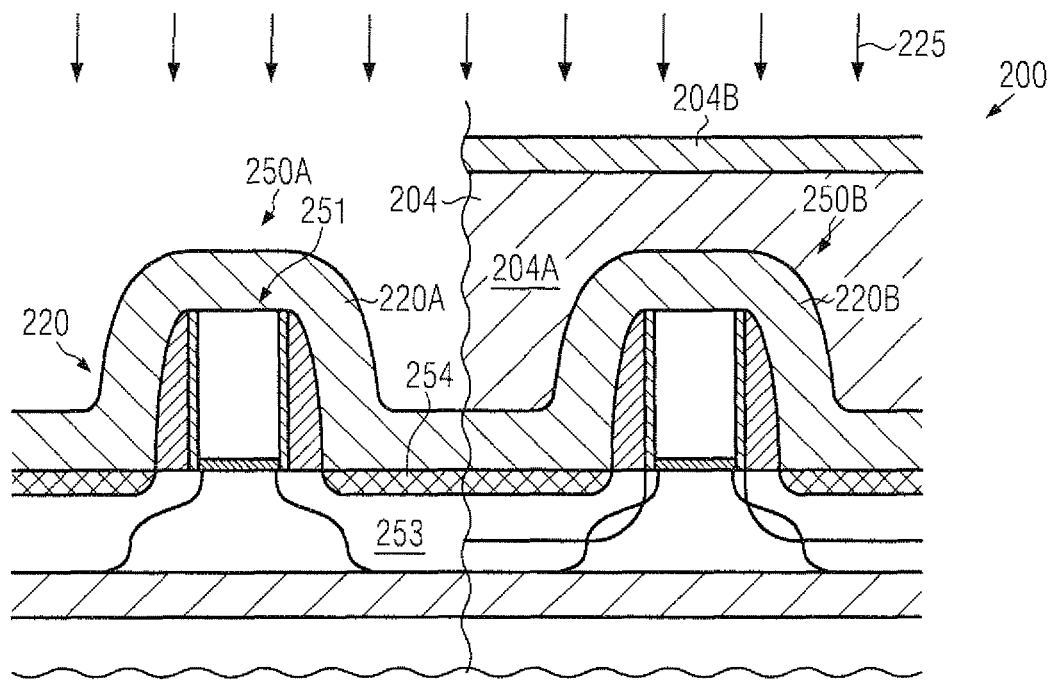

FIG. 2c schematically illustrates the semiconductor device 200 when exposed to radiation 225, which has appropriate characteristics in order to initiate a structural reconfiguration, thereby also altering the initial intrinsic stress level. In some illustrative embodiments, the radiation 225 may be provided in the form of ultraviolet radiation having an appropriate wavelength or wavelength range in order to create additional Si—N bonds by removing hydrogen, as is also previously explained with reference to the dielectric material 120 when referring to FIGS. 1a and 1b. Similarly, appropriate process conditions, i.e., an appropriate exposure time for a given energy density of the radiation 225, may be determined, as discussed above with reference to the material 120 and the radiation 125. On the other hand, undue exposure of the portion 220B may be avoided or at least significantly reduced due to the presence of the exposure mask 204. For example, the surface layer 204B may efficiently reflect a significant portion of the incoming radiation 225, while the remaining portion of the radiation may be efficiently absorbed within the material 204A, thereby significantly reducing any remaining radiation that may penetrate the portion 220B. Furthermore, the exposure process based on the radiation 225 may not contribute to additional contamination, as may typically be the case in conventional strategies in which stress relaxation may be achieved by ion bombardment, as discussed above. Moreover, during the exposure process based on the radiation 225, penetration of radiation components into lower lying materials, such as the gate electrode structure 251 and the drain and source regions 253 may not substantially unduly affect the device characteristics in these areas. For example, the metal silicide regions 254 may form a highly reflective interface with the overlying dielectric material 220A, thereby reintroducing a certain amount of the initial radiation 225, which may thus result in a more efficient reconfiguration of the molecular structure above the drain and source regions 253.

Figure 2D:
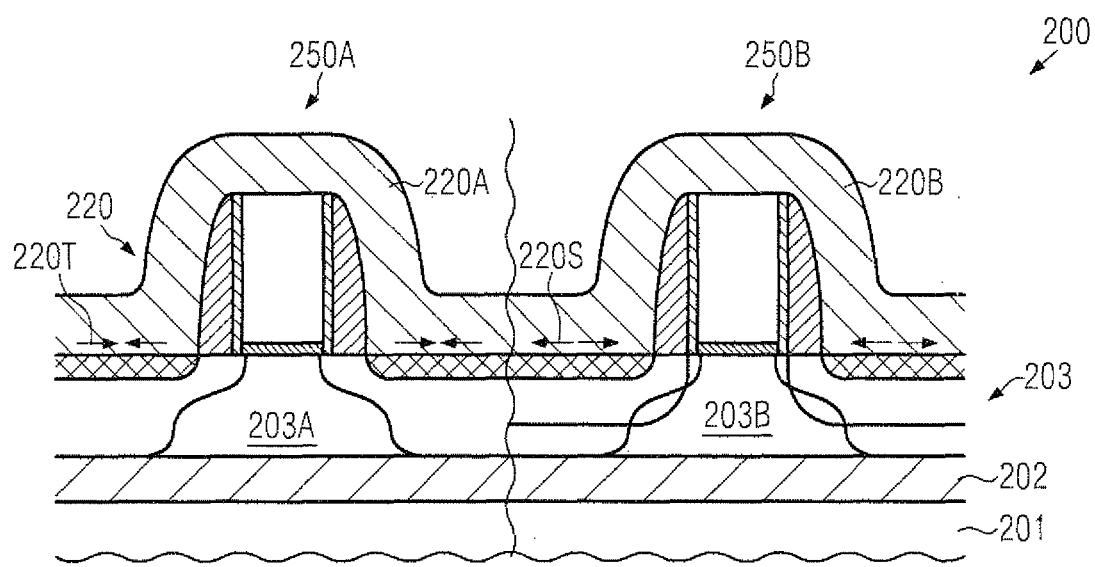

FIG. 2d schematically illustrates the semiconductor device 200 in a further advanced manufacturing stage, in which the exposure mask 204 (FIG. 2c) may be removed. For this purpose, a plurality of selective etch recipes are available, wherein the portions 220A, 220B may act as an efficient etch stop material. Furthermore, as illustrated in FIG. 2d, the portion 220A may have a modified intrinsic stress level 220T, which may be shifted towards the tensile direction with respect to the initial stress level 220S that in turn may be substantially maintained in the portion 220B. For example, the stress level 220T may represent a significantly reduced compressive stress level, when the level of stress 220S may be selected as a moderately high compressive stress. In other cases, a substantially neutral stress level may be achieved, while, in other embodiments, a tensile stress level may be achieved upon appropriately selecting the process parameters during the preceding exposure of the portion 220A, as is also previously discussed. Consequently, a local adjustment of a dielectric material formed above the active regions 203A, 203B, respectively, may be accomplished, substantially without contributing to pronounced device contamination or deteriorated characteristics, which may be conventionally caused by the incorporation of an implant species, such as germanium, xenon and the like. Moreover, since the process parameters during the exposure of the portion 220A to radiation may be selected with a high degree of accuracy, superior uniformity of performance characteristics for the device 200 may be achieved. Furthermore, since the process parameters may be varied within a wide process window, for instance with respect to energy density, exposure time and the like, a wide variety of different intrinsic stress levels may be obtained on the basis of a single deposition recipe for providing the initial layer 220.

Figure 2E:
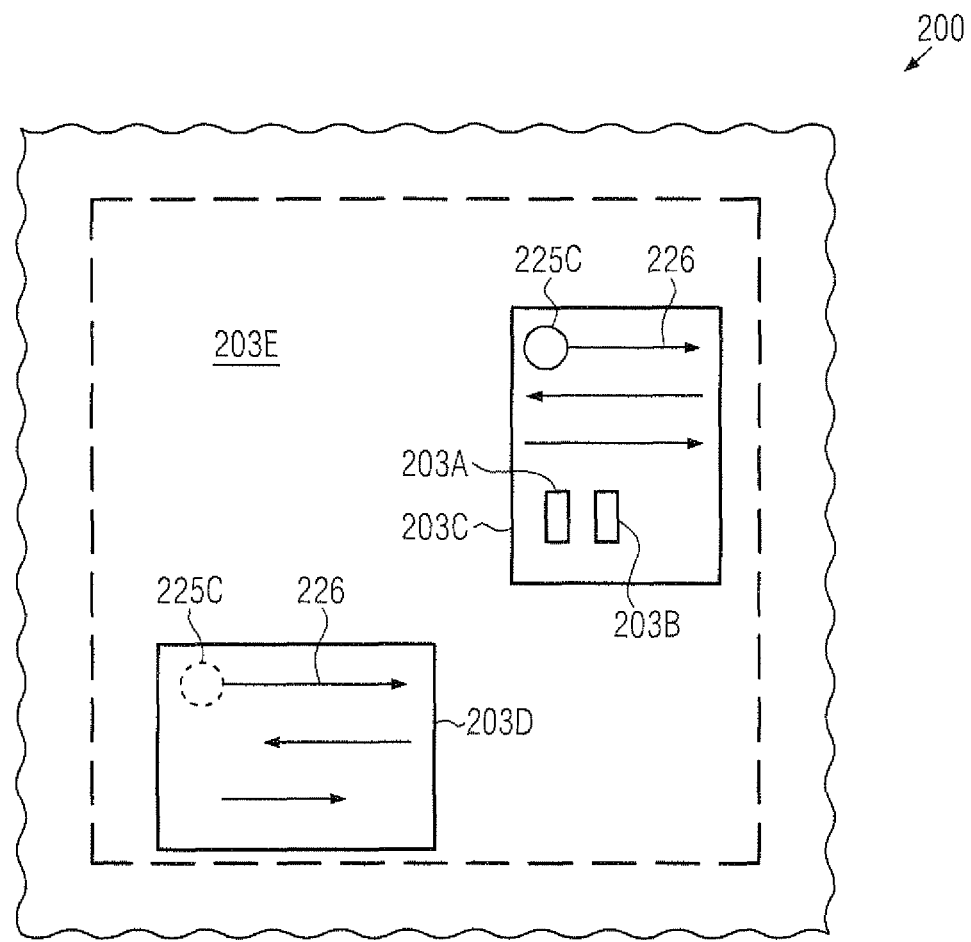
FIG. 2e schematically illustrates a top view of a semiconductor device comprising device regions that may be "globally" exposed to radiation for adjusting a global stress level of a dielectric material, according to further illustrative embodiments.

FIG. 2e schematically illustrates a top view of the semiconductor device 200 according to further illustrative embodiments in which, in addition or alternatively to a local patterning of the stress level on the basis of an exposure mask, the radiation is provided in a locally restricted manner, thereby selectively exposing certain device areas, wherein the spatial resolution of the locally restricted exposure may be defined by the resolution capabilities of a corresponding exposure tool. As illustrated, the device 200 may comprise a plurality of device areas 203C, 203D and 203E, which may be located within a single die area of the device 200. For instance, it may be assumed that the device areas 203C, 203D may require an adaptation of the intrinsic stress level of a dielectric material (not shown), such as the dielectric layer 220 as previously discussed with reference to FIGS. 2a-2d. On the other hand, the device area 203E may not require a stress modification and, thus, this area should be excluded from exposure by any appropriate radiation. Furthermore, if required, one or more of the regions 203C, 203D, may comprise semiconductor regions, such as regions 203A, 203B, which may require a selective exposure/non-exposure, which may be beyond the resolution capabilities of an exposure tool, thereby requiring an exposure mask, such as the mask 204 as previously discussed with reference to FIG. 2c. In other cases, a corresponding "fine structure" with respect to exposure to radiation may not be required in the regions 203C, 203D.

After the deposition of the dielectric material having the basic intrinsic stress level, a radiation spot 225C of laterally restricted dimensions may be generated, for instance, by any appropriate radiation source, such as a laser system with an appropriate optical system and the like, in combination with an appropriate scan system, which may be controlled on the basis of an appropriate scan regime. Consequently, the beam spot 225C may be scanned across the region 203C in accordance with a corresponding scan pattern 226 in order to expose the region 203C with a desired exposure dose. For example, based on a given energy density of the beam spot 225C, the effective exposure dose may be adjusted on the basis of the scan speed, thereby enabling a time efficient adjustment of the finally desired stress level of a corresponding dielectric material. Similarly, the beam spot 225C may be positioned within the region 203D and may be moved across this region according to a specific scan regime 226, wherein parameters may be selected so as to obtain the desired degree of stress modification in the region 203D, which may differ from the degree of modification in the region 203C. It should be appreciated that degree of stress modification may also be adjusted by varying the energy density of the beam spot 225C, for instance, by varying the size thereof for a given energy density of a basic radiation beam and the like, if desired. Consequently, the regions 203C, 203D may be selectively exposed to an appropriate radiation density, thereby enabling an efficient local adaptation of an intrinsic stress level, without requiring an additional mask, if the regions 203C, 203D may not require a fine patterning of the area internal stress level.

Figure 2F:
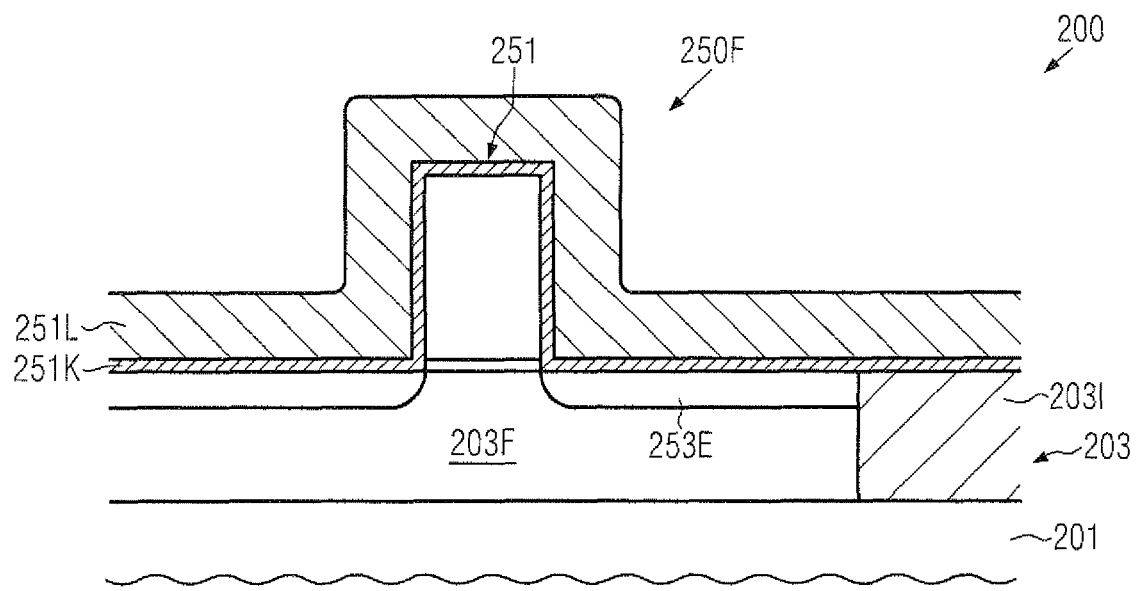
FIGS. 2f-2h schematically illustrate cross-sectional views of a semiconductor device during various manufacturing stages, in which the stress level of special elements may be adjusted on the basis of ultraviolet radiation, according to still further illustrative embodiments.
Figure 2G:
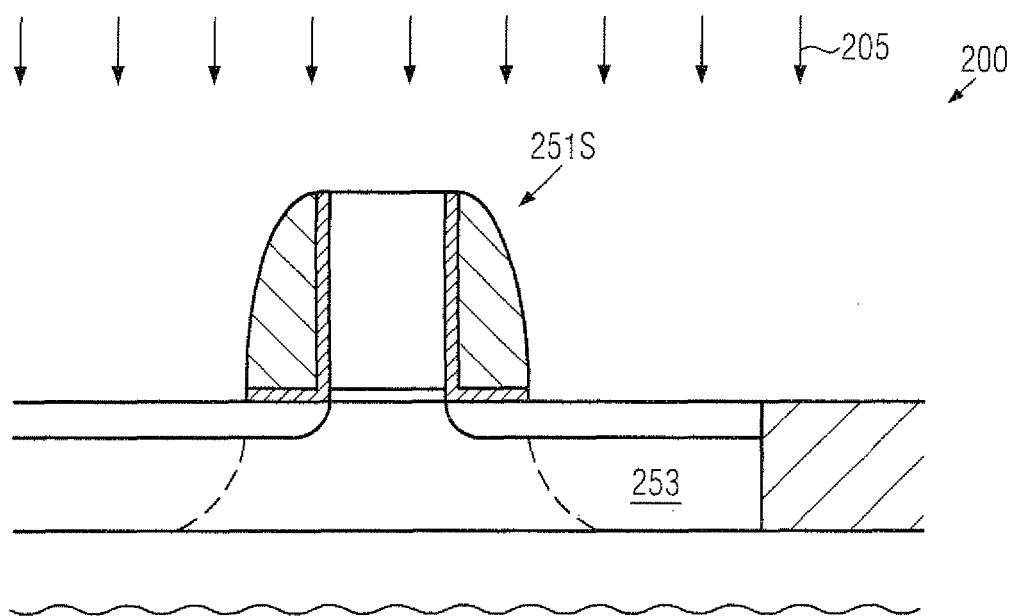
Figure 2H:
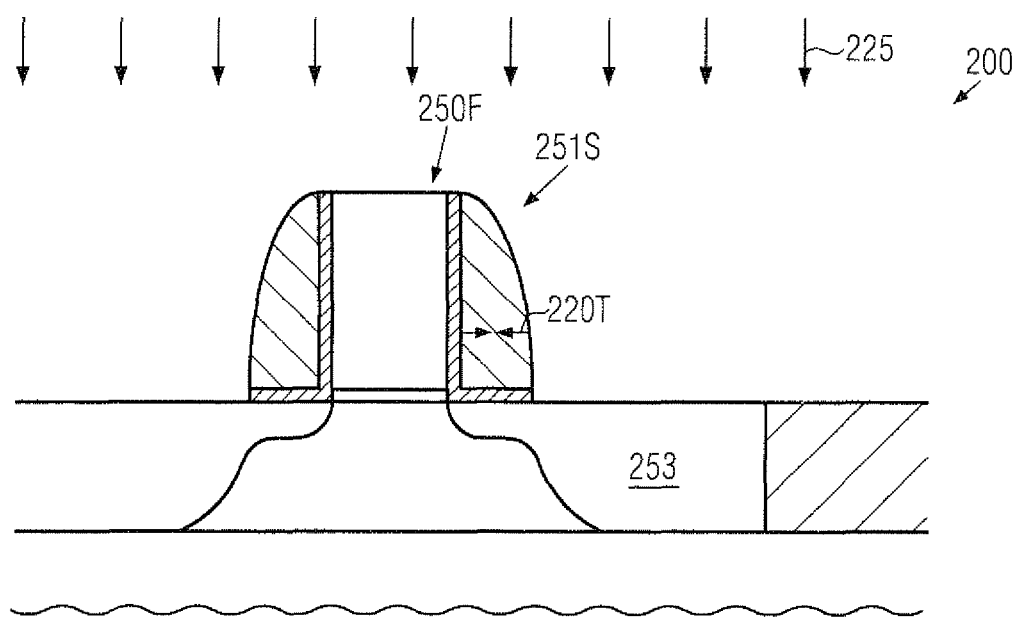

With reference to FIGS. 2f-2h, further illustrative embodiments will now be described in which the stress adjustment on the basis of radiation may be performed in an early manufacturing stage.

FIG. 2f schematically illustrates the semiconductor device 200, which may comprise the substrate 201 and the semiconductor layer 203 formed above the layer 201 so as to define a "bulk" configuration, i.e., a configuration in which the semiconductor layer 203 is formed on a crystalline material of the substrate 201. Furthermore, an active semiconductor region 203F may be provided within the layer 203, for instance, by providing an isolation structure 203I that laterally delineates the active region 203F. Moreover, a transistor 250F in an intermediate manufacturing stage may be partly formed in and above the active region 203F and may comprise a gate electrode structure 251 and drain and source extension regions 253E. Moreover, a spacer layer 251L, such as a silicon nitride material, may be formed above the gate electrode structure 251 and the active region 203F and may have an appropriate internal stress level, such as a compressive stress level, a substantially neutral stress level or a tensile stress level. Furthermore, if required, an etch stop liner 251K, such as a silicon dioxide material, may be formed below the spacer layer 251L.

With respect to any manufacturing techniques for forming the semiconductor device 200 as shown in FIG. 2f, well-established process techniques may be applied in order to form the isolation structure 203I and the gate electrode structure 251. Moreover, the extension regions 253E may be formed by applying well-established implantation techniques, followed by the deposition of the layers 251K, 251L, which may be accomplished on the basis of plasma enhanced deposition techniques, thermally activated deposition techniques and the like. It should be appreciated that an internal stress level of the layer 251L may be selected such that the desired strain characteristics may be obtained in other transistor elements while the transistor 250F may require a different intrinsic stress level. Moreover, in some illustrative embodiments, prior to modifying the stress level of the material 251KL, the spacer layer 251L may be patterned on the basis of well-established etch techniques.

FIG. 2g schematically illustrates the device 200 with the spacer structure 251S, which may be formed from the layers 251L, 251K of FIG. 2f. Moreover, the device 200 may be exposed to an implantation process 205 in order to introduce the dopant species as required for forming the drain and source regions 253. It should be appreciated that, if required, other device areas may be covered by an implantation mask in order to avoid undue incorporation of the dopant species in these areas.

FIG. 2h schematically illustrates the semiconductor device 200 when exposed to radiation 225 in order to modify the intrinsic stress level of the spacer structure 251S. As previously explained, a reconfiguration of the molecular structure may be initiated on the basis of the radiation 225, thereby shifting the intrinsic stress level towards the tensile direction, which may result in the stress level 220T. Furthermore, in other device areas, the implantation mask may still be in place, thereby significantly reducing an interaction of the radiation 225 with underlying spacer structures, so that a significant portion of the initial stress level may be preserved in these masked device areas. Consequently, dielectric materials, such as spacer layers, may be provided on the basis of uniform process conditions with a uniform initial stress level, which may be subsequently locally modified on the basis of the radiation 225, thereby providing the spacer structures 251S with different intrinsic stress levels.

It should be appreciated that the stress modification of the spacer structure 251S may be advantageously combined with the stress patterning mechanism as described above with reference to FIGS. 2a-2e.

As a result, the present disclosure provides semiconductor devices and techniques in which the intrinsic stress level of dielectric materials, such as silicon nitride based materials, may be efficiently modified on the basis of radiation, such as ultraviolet radiation, without requiring the incorporation of implantation species, such as xenon, germanium and the like, which may result in contamination and device failures in conventional stress relaxation techniques. Consequently, an efficient strain-inducing mechanism may be applied in semiconductor devices requiring moderately thin dielectric materials due to a sophisticated device geometry, for instance by providing a contact etch stop layer above densely packed device areas. Thus, the substantially defect free implementation of the strain patterning mechanism in combination with superior controllability and a wide process window may allow superior uniformity of the resulting performance characteristics.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a dielectric layer above a first semiconductor region and a second semiconductor region of a semiconductor device; and
    selectively adjusting an intrinsic stress level of said dielectric layer by exposing a first uncovered part of a surface of a first portion of said dielectric layer above said first semiconductor region to radiation while substantially avoiding exposing a second uncovered part of a surface of a second portion of said dielectric layer above said second semiconductor region to said radiation.

2. The method of claim 1, wherein selectively adjusting said intrinsic stress level of said dielectric layer comprises forming a patterned radiation mask so as to cover a part of said surface of said second portion, expose said second uncovered part of said surface of said second portion, and expose said first uncovered part of said surface of said first portion.

3. The method of claim 1, wherein selectively adjusting said intrinsic stress level of said dielectric layer comprises selectively moving a beam spot of said radiation across said first portion, said beam spot having laterally restricted dimensions.

4. The method of claim 1, wherein forming said dielectric layer comprises depositing a dielectric material so as to have an intrinsic compressive stress level.

5. The method of claim 1, wherein forming said dielectric layer comprises depositing a dielectric material as a substantially stress neutral material.

6. The method of claim 1, wherein forming said dielectric layer comprises depositing a dielectric material so as to have an intrinsic tensile stress level.

7. The method of claim 1, further comprising forming one or more first transistors in and above said first semiconductor region and forming one or more second transistors in and above said second semiconductor region, wherein said first and second transistors are of different conductivity type.

8. The method of claim 7, wherein said one or more first transistors are n-channel transistors.

9. The method of claim 1, wherein said radiation comprises ultraviolet radiation.

10. The method of claim 7, wherein said dielectric layer is formed with thickness of approximately 50 nm or less.

11. The method of claim 1, wherein adjusting said intrinsic stress level comprises adjusting said intrinsic stress level from a first compressive stress level to a second compressive stress level having a lower magnitude than said first compressive stress level.

12. The method of claim 1, wherein adjusting said intrinsic stress level comprises adjusting said intrinsic stress level from a compressive stress level to one of a substantially neutral stress level and a tensile stress level.

13. The method of claim 1, wherein adjusting said intrinsic stress level comprises adjusting said intrinsic stress level from a substantially neutral stress level to a tensile stress level.

14. The method of claim 1, wherein adjusting said intrinsic stress level comprises adjusting said intrinsic stress level from a first tensile stress level to a second tensile stress level having a higher magnitude than said first tensile stress level.

15. The method of claim 1, wherein forming said dielectric layer comprises forming a material layer comprising silicon nitride.

16. The method of claim 1, wherein said radiation comprises electron bombardment.

17. A method, comprising:
    forming a dielectric material layer having an intrinsic stress above first and second regions of a semiconductor device, said dielectric material layer comprising a first portion formed above said first region and a second portion formed above said second region; and selectively adjusting a level of said intrinsic stress in said first portion of said dielectric material layer by exposing a first uncovered part of said first portion to radiation while substantially avoiding exposing a second uncovered part of said second portion to said radiation, wherein substantially avoiding exposing said second uncovered part comprises exposing said first uncovered part to a beam spot of said radiation, said beam spot having laterally restricted dimensions.

18. The method of claim 17, wherein adjusting said level of said intrinsic stress comprises adjusting said level of said intrinsic stress from a first intrinsic stress level to a second intrinsic stress level that is different than said first intrinsic stress level.

19. The method of claim 18, wherein adjusting said level of said intrinsic stress from said first intrinsic stress level to said second intrinsic stress level comprises adjusting said level of said intrinsic stress from a compressive stress level to one of a substantially neutral stress level and a tensile stress level.

20. The method of claim 17, wherein exposing said first uncovered part of said first portion to radiation comprises exposing said first uncovered part to at least one of ultraviolet radiation and electron bombardment.

21. The method of claim 17, further comprising forming a patterned radiation mask above said dielectric material layer prior to exposing said first uncovered part of said first portion of said dielectric material layer to said radiation.

22. The method of claim 21, wherein forming said patterned radiation mask comprises forming a mask material above said dielectric material layer and patterning said mask material to expose said first uncovered part of said first portion of said dielectric material layer, expose said second uncovered part of said second portion of said dielectric material layer, and cover at least a covered part of said dielectric material layer.

23. The method of claim 18, wherein forming said dielectric material layer comprises forming a material layer comprising silicon nitride.

* * * * *

UNITED STATES PATENT AND TRADEMARK OFFICE
CERTIFICATE OF CORRECTION

PATENT NO.       : 8,426,262 B2
APPLICATION NO.  : 12/862203
DATED            : April 23, 2013
INVENTOR(S)      : Jan Hoentschel et al.

It is certified that error appears in the above-identified patent and that said Letters Patent is hereby corrected as shown below:

In the Claims:

Col. 16, line 43 (claim 10, line 2), change "with thickness" to -- with a thickness --.

Signed and Sealed this
Eighteenth Day of June, 2013

Teresa Stanek Rea
*Acting Director of the United States Patent and Trademark Office*